(12) United States Patent
Hwu et al.

(10) Patent No.: US 7,923,271 B1
(45) Date of Patent: Apr. 12, 2011

(54) METHOD OF ASSEMBLING MULTI-LAYER LED ARRAY ENGINE

(75) Inventors: Jon-Fwu Hwu, Hsinchu (TW); Yung-Fu Wu, Hsinchu (TW)

(73) Assignee: GEM Weltronics TWN Corporation, Hsinchu County (TW)

( * ) Notice: Subject to any disclaimer, the term of this patent is extended or adjusted under 35 U.S.C. 154(b) by 0 days.

(21) Appl. No.: 12/725,461

(22) Filed: Mar. 17, 2010

(51) Int. Cl.
*H01L 21/00* (2006.01)

(52) U.S. Cl. ............. 438/26; 438/27; 438/28; 438/29

(58) Field of Classification Search ............ 438/22, 438/26, 29, 27; 257/E25.058
See application file for complete search history.

(56) References Cited

U.S. PATENT DOCUMENTS

| 7,161,189 | B2 * | 1/2007 | Wu ................................ 257/98 |
| 7,709,857 | B2 * | 5/2010 | Kim et al. ..................... 257/100 |
| 2006/0102917 | A1 * | 5/2006 | Oyama et al. .................. 257/99 |
| 2010/0314654 | A1 * | 12/2010 | Hayashi ......................... 257/99 |

* cited by examiner

*Primary Examiner* — Michael Trinh (57) ABSTRACT

A method of assembling a multi-layer LED array engine is provided. The method includes the steps of: preparing a base plate frame comprising at least one lighting area, and two lead frame grooves; positioning two lead frames inside accommodating spaces defined in the two lead frame grooves, respectively; executing an injection molding process to form a molded platform on the base plate frame; configuring a thin layer of nickel or chromium; arranging a plurality of LED dice in an array form on an upper surface of the base plate frame; electrically coupling the LED dice to the lead frames by bonded wires; forming a protection layer on the LED dice and the bonded wires; forming a phosphorous layer on the protection layer, wherein the phosphorous layer is formed within a range defined by the phosphorous wall; and forming a dome on the upper surface of the molded platform by executing an injection molding process.

20 Claims, 11 Drawing Sheets

METHOD OF ASSEMBLING MULTI-LAYER LED ARRAY ENGINE

BACKGROUND OF THE INVENTION

1. Field of the Invention

The present invention relates generally to a method of assembling a multilayer light emitting diode (LED) array engine. The method of assembling a multi-layer LED array engine is related to a very simple manufacturing process adapted for lowering the manufacturing cost and shortening the manufacturing cycle time of assembling the LED array engine.

2. The Related Arts

Generally, an LED emits light in accordance with the intrinsic characteristic of the solid state semiconductor of the LED. Differing from the light emitting principle of the filament light bulb, an LED emits light when a current flows to the semiconductor PN junction, and does not need to be heated to a high temperature. As such, LEDs are also known as cold light sources. LEDs typically have the advantages including better durability, longer lifespan, lower weight, and lower power consumption. Particularly and more importantly, LEDs do not contain poisonous materials, e.g., mercury or poisonous gases. Therefore, LEDs are often used in form of a secondary assembly of LED array assembled on a printed circuit board (PCB) and have been widely employed for illumination purpose in a variety of fields, such as electronic display boards, or electronic traffic signs.

Typically, a lead frame strip is often used in assembling an LED array, in which each LED is wire bonded and molded to form an LED die. Each LED die is assembled to a lead frame pocket, and the bonded wire connects the LED die with a lead of the lead frame. The LED die and a part of the lead frame are packaged and molded to form an LED unit having external leads for electrical connection.

An LED array includes a plurality of such packaged LED units surface mounted on a pre-designed PCB or a ceramic substrate, in an array form. Such architecture is also known as a secondary level assembly of LED units. This architecture may be applied in the fields of electronic display boards or electronic traffic signs. However, according to the secondary level assembly architecture, the size of the LED products is restricted by the packaged LED unit, since the size of the packaged LED unit is much larger than the size of the die. Further, although not much, LEDs generate heat when emit light, and the only way of dissipating the generated heat in this specific architecture is from the leads to the metal lead frames. However, the leads are usually too thin to be good enough for dissipating the heat generated thereby.

According to another conventional method assembling a multi-layer LED array, a plurality of LED dice are provided directly onto a pre-designed PCB. Specifically, the PCB is configured with circuits corresponding to the LED dice. The LED dice are electrically connected to the circuits of the PCB by bonded wires or bumps. And then, a silicon gel is used to seal the entirety of the LED array onto the PCB to form a package.

As discussed above with respect to the conventional technologies, the PCB also serves as the substrate of the LED array. However, a PCB is usually fabricated by many complicated processes including lithographing, stamping, drilling, and plating copper in through holes. As to the LED array, what is needed for lighting up the LED array is a loop electrically connecting thereto and supplying a current thereto. When being further provided with a heat dissipation device, the LED array can achieve a certain light emitting performance during a certain life span. Therefore, it is very much desired to provide a method of making an LED array while simplifying the operation process and saving production cost and time thereof.

SUMMARY OF THE INVENTION

Accordingly, a primary objective of the present invention is to provide a method of assembling a multi-layer LED array engine for simplifying the operation process and saving production cost and time thereof.

For achieving the foregoing objective and others, the present invention provides a method of assembling a multi-layer LED array engine. The method includes the following steps. At first, a base plate frame is prepared. In accordance with a top view of the base plate frame, the base plate frame has a front side, a rear side, a left side, a right side, and a center. The base plate frame includes at least a lighting area, and two lead frame grooves. The lighting area is located at the center of the base plate frame. The two lead frame grooves are positioned at the front side and the rear side, respectively. The base plate frame is configured with at least one first locking hole and at least one through hole at each of the left side and the right side. The base plate frame is further configured with at least two rectangular dented grooves at an edge of a bottom side of the base plate frame corresponding to each of the two lead frame grooves. The two dented grooves are spaced one from another. Then, two lead frames are placed inside accommodating spaces defined in the two lead frame grooves, respectively, while the two lead frames remain noncontact with the base plate frame. An upper surface of each of the two lead frames is at least not lower than an upper surface of the lighting area. Each lead frame includes an inner connection portion and an outer connection portion. The inner connection portion is positioned adjacent to the lighting area, and the outer connection portion is positioned relatively apart from the lighting area. The outer connection portion protrudes exceeding a peripheral edge of the base plate frame. Each lead frame is further configured with at least one second locking hole and at least two second lock-in grooves between the inner connection portion and the outer connection portion. The two second lock-in grooves are positioned at two sides of the second locking hole, and adjacent to the light area. A portion of the lead frame is reserved for wire bonding.

An injection molding process is executed to form a molded platform on the base plate frame. The molded platform surrounds the light areas, buries the dented grooves, fills up the lead frame grooves, and covers the lead frames. The molded platform does not cover the upper side of the inner connection portion and the periphery of the outer connection portion. The molded platform is configured surrounding the lighting area, and filling up the first locking holes. A portion of the molded platform located above the lighting area is defined as an upper molded platform. The upper molded platform includes an inner sidewall on which an optical reflectivity surface is configured, and a phosphorous wall. The upper molded platform is further configured with a dome embedding groove at a top portion of the upper molded platform above the optical reflectivity surface. The phosphorous wall is configured beneath the inner wall of the upper molded platform. The phosphorous wall is adapted for confining a phosphorous compound provided therein. The phosphorous wall is configured with an inclined angle between 30° and 60°. According to an aspect of the present invention, the phosphorous wall and the optical reflectivity surface are sputtered with a nickel or chromium coating.

Then, a plurality of LED dices are arranged on the upper surface of the lighting area. The LED dice are then wire bonded for electrically coupling with the lead frames. A protection layer is formed to cover the LED dices and the bonded wires for providing a protection thereto. Then, a phosphorous compound is provided on the protection layer and inside the space defined by the phosphorus wall to form a phosphorous layer. In some certain circumstances, very high power LED application may be desired, and correspondingly according to an aspect of the present invention, the phosphorous wall and the optical reflectivity surface are sputtered with a nickel or chromium coating. Or alternatively, a metal reflector cap plated with a nickel or chromium coating is provided on the phosphorous wall and the optical reflectivity surface for improving the light reflectivity of the multi-layer LED array engine. A silicon dome is formed on the phosphorous layer by executing an injection molding process on the molded platform. The dome interlocks with the molded platform to achieve very tight combination therebetween. A bottom of the dome completely fills up the dome embedding groove. Such a dome is transparent and serves as a lens for converging a light passing therethrough.

According to the present invention, the Base Plate Frame is advantageously made of metal material, and is formed by a stamping process or the like. The LED Dice are then connected to the lead frame to form a circuit. As such, comparing with the conventional technology, the present invention is adapted for saving the production cost and shortening the production cycle time. Further, the heat generated by the LED array could be conveniently dissipated via the metallic base plate frame to an external heat sink. In such a way, the LED array could be well protected from being overheated, and thus the life span of the LED array engine could be prolonged.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawing illustrates embodiments of the invention and, together with the description, serves to explain the principles of the invention.

Figure 1:
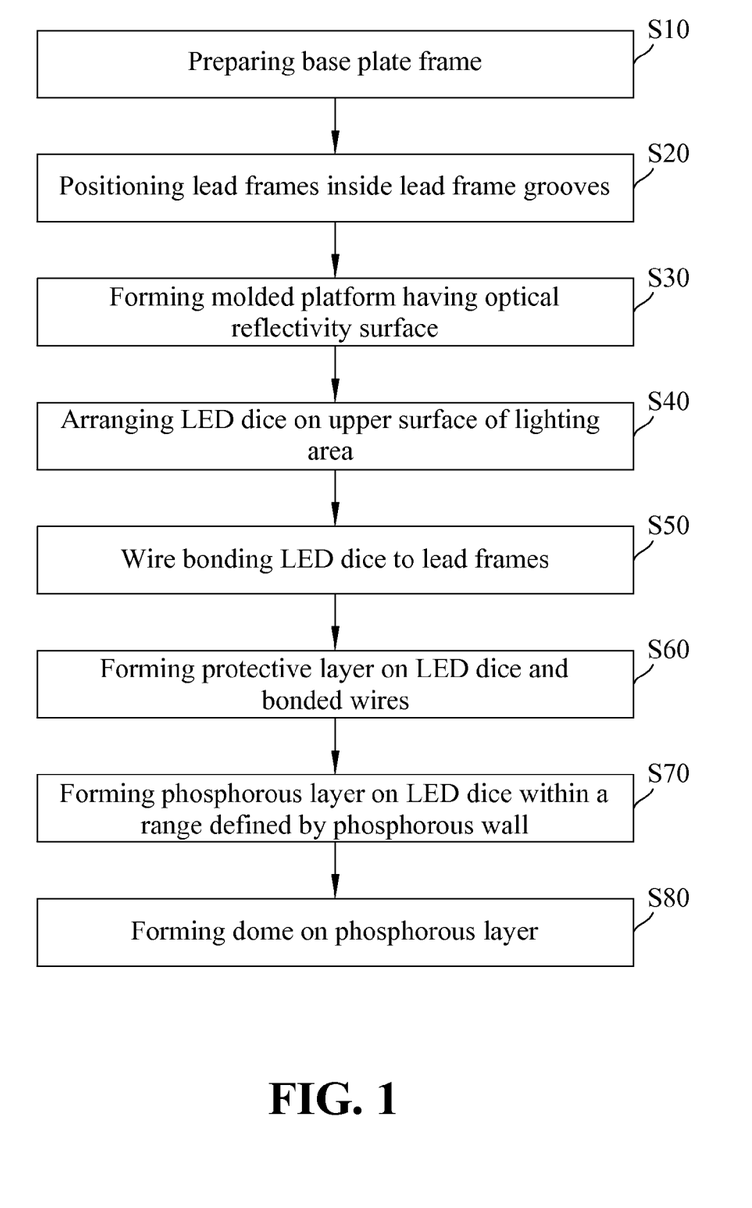
FIG. 1 is a flow chart illustrating a method of assembling a multi-layer LED array engine according to an embodiment of the present invention.
Figure 2:
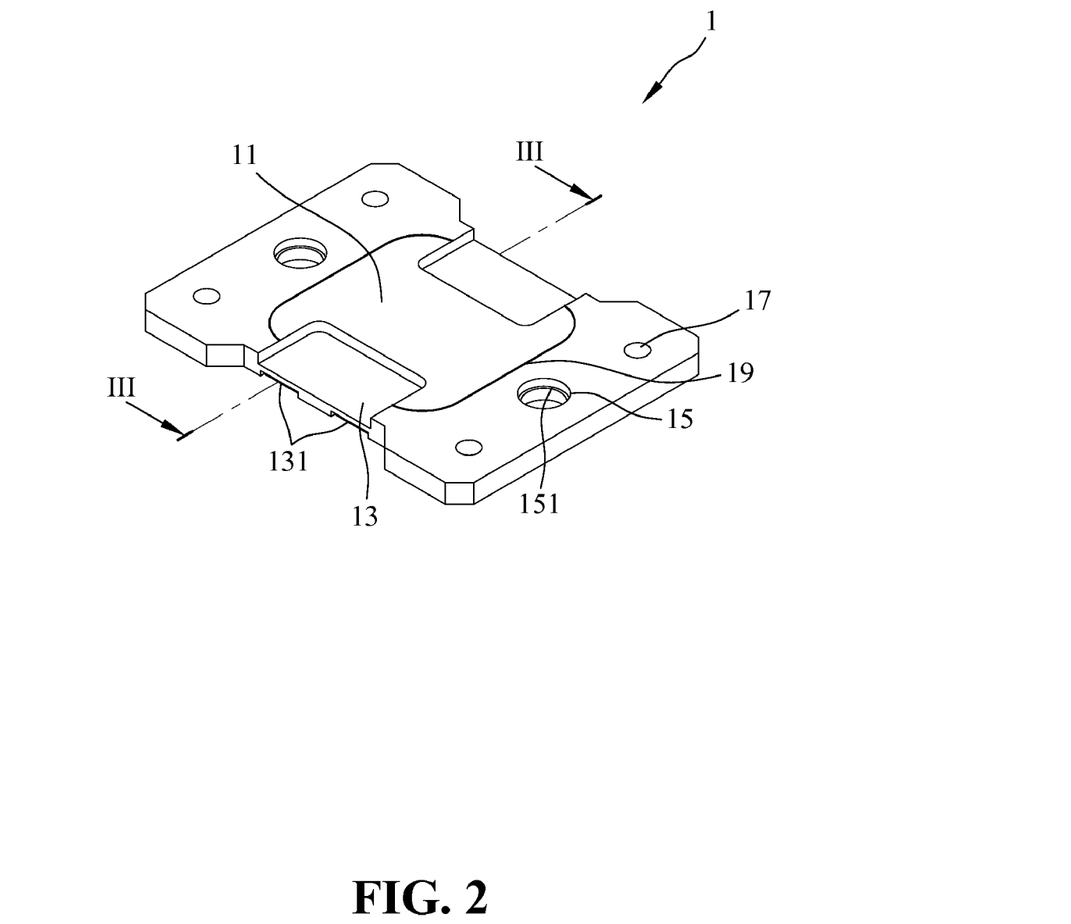
FIG. 2 is a perspective view of a base plate frame of the multilayer LED array engine according to an embodiment of the present invention.
Figure 3:
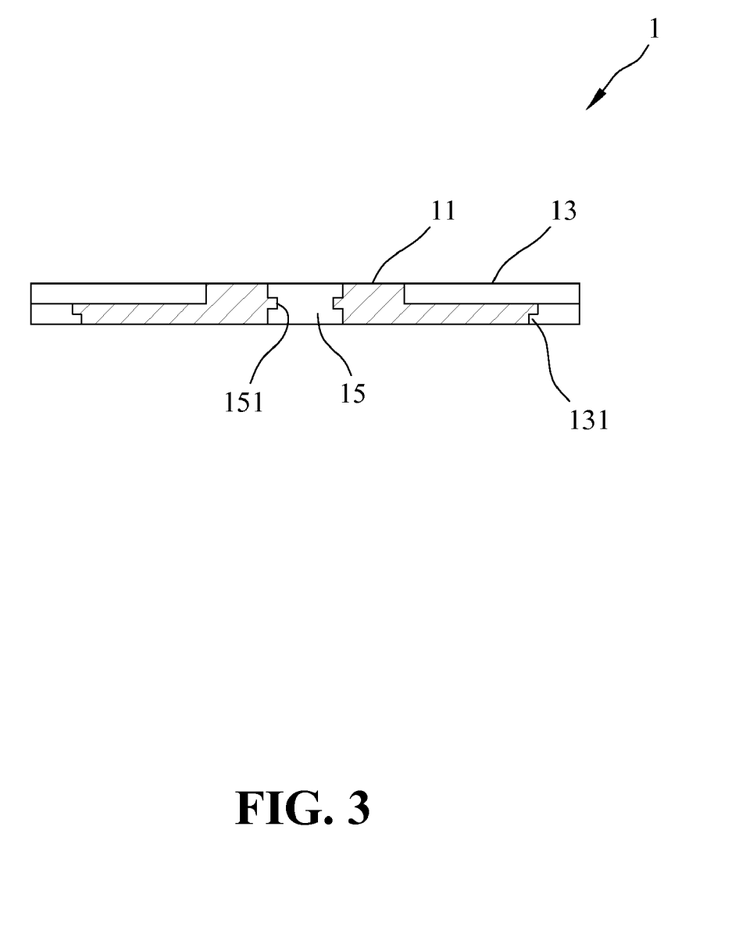
FIG. 3 is a cross-sectional view of the base plate frame of FIG. 2 taken along line III-III.

FIG. 1 is a flow chart illustrating a method of assembling a multi-layer LED array engine according to an embodiment of the present invention. FIG. 2 is a perspective view of a base plate frame of the multilayer LED array engine according to an embodiment of the present invention. FIG. 3 is a cross-sectional view of the base plate frame of FIG. 2 taken along line III-III.

Referring to FIGS. 1-3, in the step S10 as shown in FIG. 1, a base plate frame 1 is prepared. The base plate frame 1 can be prepared by executing a stamping process, a chemical etching process, a high voltage wire cutting process, or any other suitable processes. For example, the base plate frame is made of a metal material. Preferably, the metal material is selected from the group consisting of copper (Cu), aluminum (Al), Cu alloy, and Al alloy. Further, according to an aspect of the embodiment, a reflective layer (not shown in the drawings) is deposited on the base plate frame 1. The reflective layer has an optimal thermal conductivity and outstanding light reflectivity. The reflective layer for example can be made of palladium (Pd), nickel (Ni), chromium (Cr), Au alloy, or other suitable metal materials.

The base plate frame 1 includes at least one lighting area 11 and two lead frame grooves 13. As shown in FIG. 2, viewing from a top side, the base plate frame 1 has a front side, a rear side, a left side, a right side, and a center. The lighting area 11 is located at the center of the base plate frame 1. The base plate frame 1 is configured with a first locking groove 19 having a U-shaped, V-shaped, recess-shaped, or other suitable shaped cross-section. The first locking groove 19 is configured hereby surrounding the lighting area 11 and reserved for subsequent operation. The two lead frame grooves 13 are configured at the front side and the rear side of the base plate frame 1 and are positioned at two opposite sides of the lighting area 11, respectively. The base plate frame 1 is configured with at least one first locking hole 15 and at least one through hole 17 at each of the left side and the right side adjacent to the lighting area 11. A protruded edge 151 is configured on an inner wall of the first locking hole 15. Or alternatively, as shown in FIG. 2, the base plate frame 1 is configured with one first locking hole 15 and two through holes 17 at each of the left side and the right side of the base plate frame 1. The two through holes 17 are positioned at two lateral sides of the first locking hole 15 or at the corners of the left side and right side. The base plate frame 1 is further configured with at least two strip-shaped dented grooves 131 at an edge of a bottom side of the base plate frame 1 corresponding to each of the two lead frame grooves 13. The two dented grooves 131 are spaced one from another.

Figure 4:
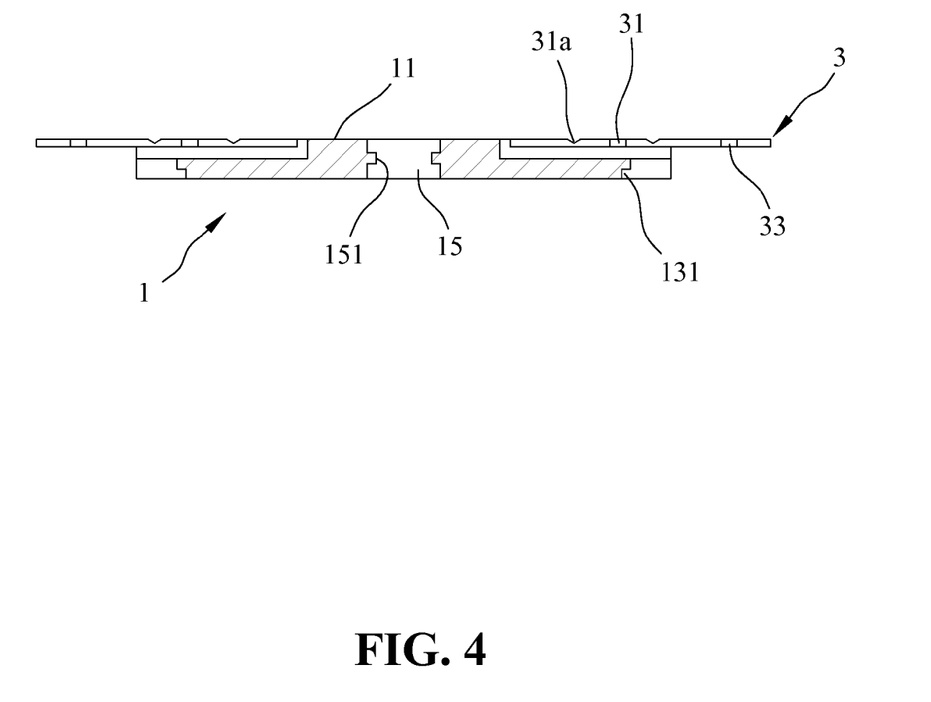
FIG. 4 is a schematic diagram illustrating lead frames disposed on the base plate frame according to the present invention.

Then, the flow enters step S20. FIG. 4 is a schematic diagram illustrating lead frames disposed on the base plate frame according to the present invention. As shown in FIG. 4, two lead frames 3 are placed inside spaces defined in the two lead frame grooves 13, respectively, during which the leads frame 3 are maintained noncontact with the base plate frame 1. A top surface of each of the two lead frames 3 is at least not lower than an upper surface of the lighting area 11. Each lead frame 3 includes an inner connection portion and an outer connection portion. The inner connection portion is positioned adjacent to the lighting area 11, and the outer connection portion is positioned relatively apart from the lighting area 11. The outer connection portion protrudes exceeding a peripheral edge of the base plate frame 1. The outer connection portion is configured with a plurality of solder holes 33. Each lead frame 3 is further configured with at least one second locking hole 31 and at least one second lock-in groove 31a between the inner connection portion and the outer connection portion. Or alternatively, as shown in the drawings, there are configured with three second locking holes 31 and two solder holes 33. Preferably, the second lock-in groove 31a has a U-shaped, V-shaped, recess-shaped, or other suitable shaped cross-section.

Figure 5:
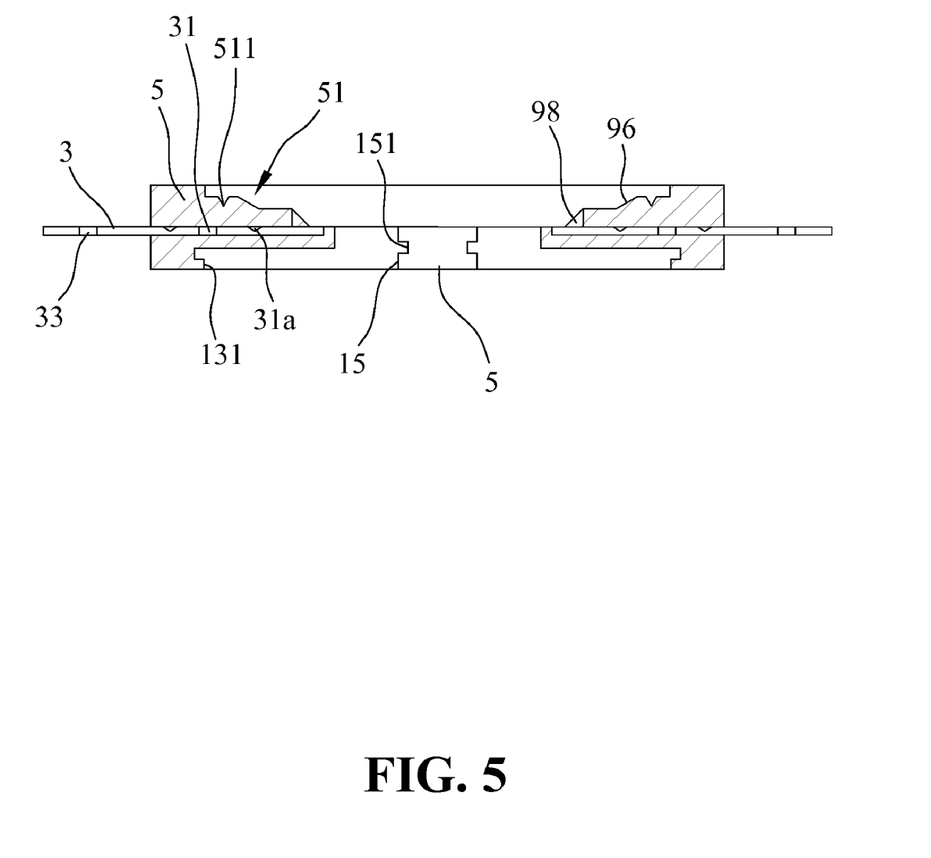
FIG. 5 is a schematic diagram illustrating a molded platform according to an embodiment of the present invention.

FIG. 5 is a schematic diagram illustrating a molded platform according to an embodiment of the present invention. Referring to FIG. 5, the flow enters step S30. An injection molding process is executed to form a molded platform 5 on the base plate frame 1 between the lighting area 11 and the through holes 17. The material used in the injection molding process is preferably a white reflective molding epoxy or other suitable materials. The molded platform 5 buries the dented grooves 131 until filling up the spaces of the lead frame grooves 13, and covers the lead frames 3. The molded platform 5 does not cover the upper side of the inner connection portion and the periphery of the outer connection portion. In other words, inner spaces of the second locking hole 31 and the second lock-in groove 31a are completely filled up by the epoxy. Further, the molded platform 5 buries the periphery of the lighting area 11 and fills up the inner spaces of the first locking hole 15 and the first locking groove 19. In such a way, the molded platform 5 is tightly combined with the base plate frame 1 as a whole. A portion of the molded platform 5 located above the lighting area 11 is defined as an upper molded platform 51. The upper molded platform 51 includes an inner sidewall on which an optical reflectivity surface 96 is configured, and a phosphorous wall 98. The upper molded platform 51 is further configured with a dome embedding groove 511 at a top portion of the upper molded platform 51 above the optical reflectivity surface 96. The dome embedding groove 511 has a V-shaped or other suitable shaped cross-section. The phosphorous wall 98 is positioned beneath the inner wall of the upper molded platform 51. The phosphorous wall 98 is configured surrounding the lighting area 11 with an inclined angle between 30° to 60° relative to the upper surface of the lighting area 11 for confining a phosphorous compound provided therein. Preferably, the optical reflectivity surface 96 is configured with an inclined angle between 30° and 60° relative to upper surface of the lighting area 11. As shown in FIG. 5, there is a step configured between the inner sidewall of the upper molded platform 51 and the phosphorous wall 98. The optical reflectivity surface 96 is preferably a light reflective surface of the inner sidewall of the upper molded platform 51 configured by sputtering to deposit nickel or chromium onto the inner sidewall of the upper molded platform 51.

Figure 6:
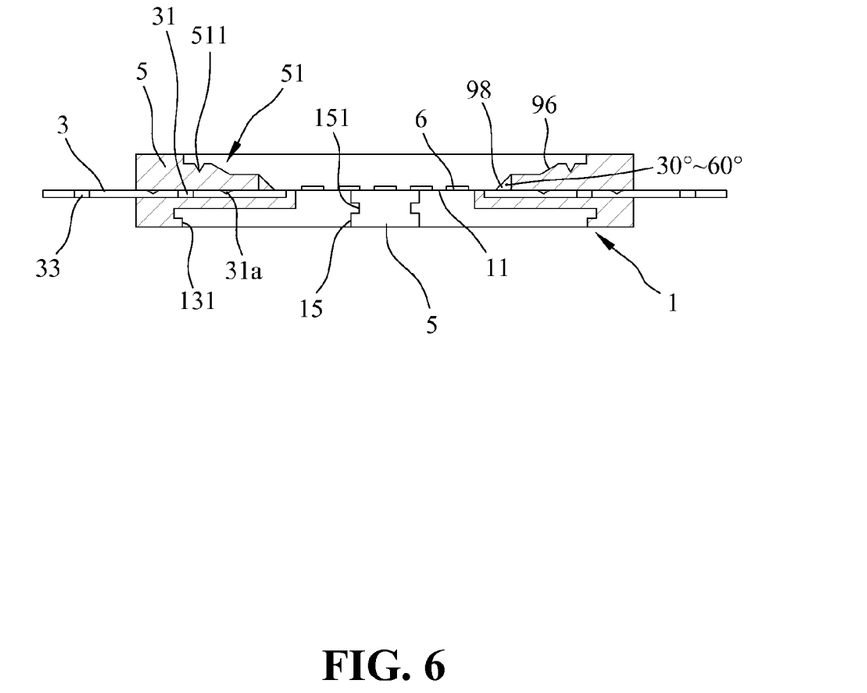
FIG. 6 is a schematic diagram illustrating LED dice arranged on the molded platform according to an embodiment of the present invention.
Figure 7:
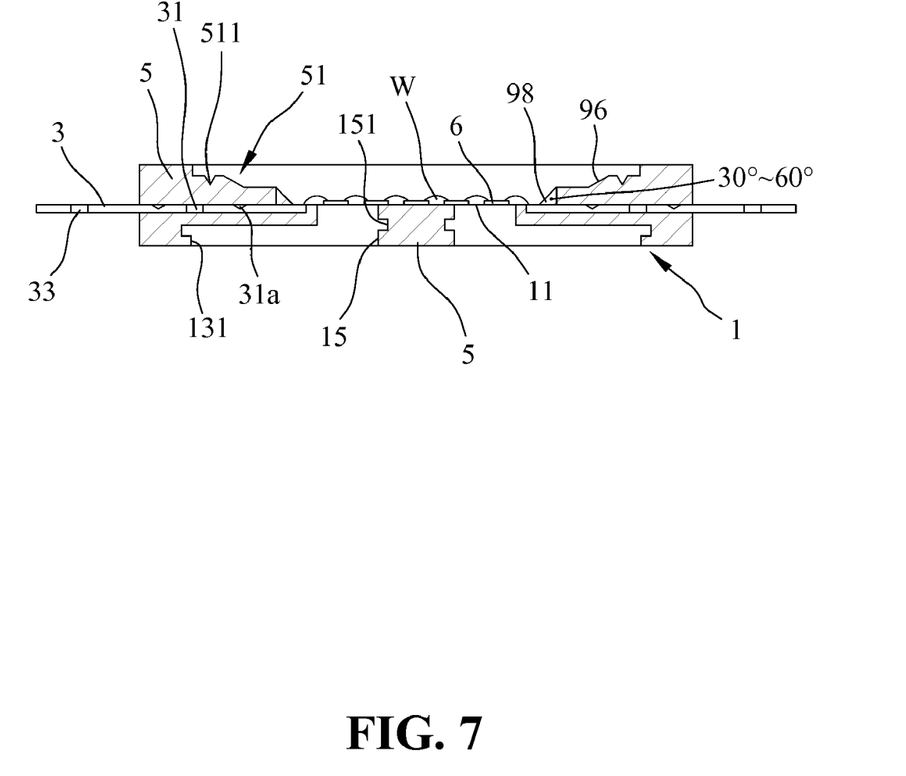
FIG. 7 is a schematic diagram illustrating the leads electrically connecting the LED dice with the lead frames according to an embodiment of the present invention.

FIG. 6 is a schematic diagram illustrating LED dice arranged on the molded platform according to an embodiment of the present invention. FIG. 7 is a schematic diagram illustrating the leads electrically connecting the LED dice with the lead frames according to an embodiment of the present invention. Referring to FIGS. 6 and 7, the flow enters step S40, in which a plurality of LED dice 6 are arranged on the upper surface of the lighting area 11. The arrangement of the LED dice 6 on the upper surface of the lighting area 11 is preferably in an array form. Then, the flow enters step S50, in which the LED dice are then wires bonded to electrically couple to the lead frames 3 with Au wires or Cu wires W.

Figure 8:
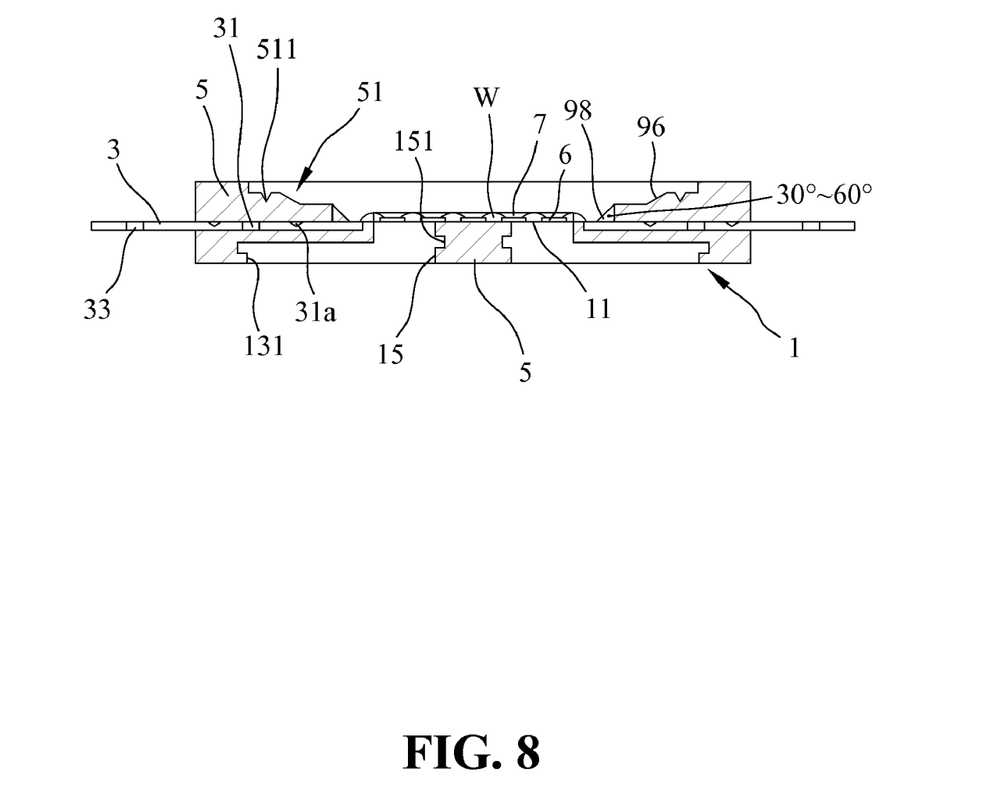
FIG. 8 illustrates a protection layer according to an embodiment of the present invention.

FIG. 8 illustrates a protection layer according to an embodiment of the present invention. Referring to FIG. 8, in step S60, a protection layer 7 is formed on the LED dice 6 and the wires. The protection layer 7 is preferably a thin film epoxy formed on a top of the LED dice 6 and the wires W. According to an aspect of the embodiment, the protection layer 7 is made of a light transparent silicon epoxy or any other suitable material.

Figure 9:
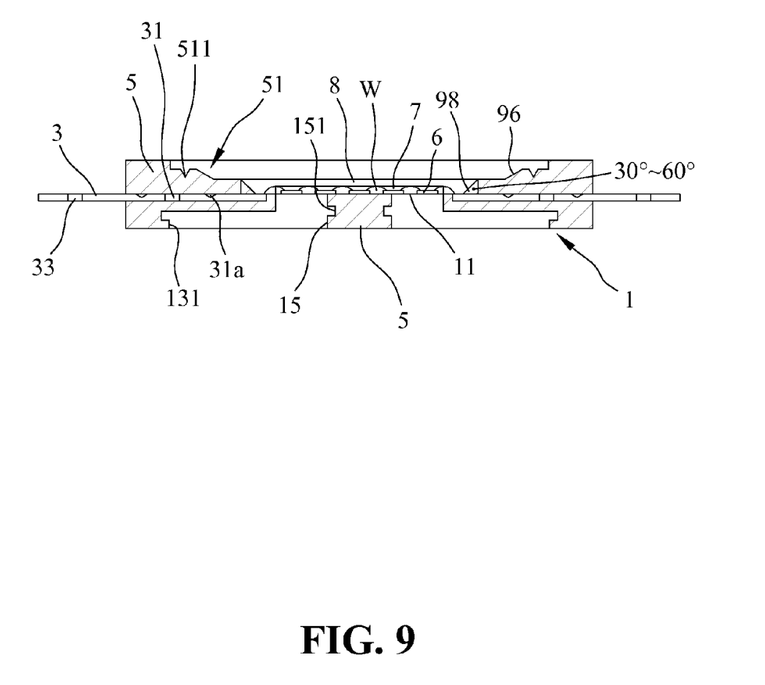
FIG. 9 illustrates a phosphorous layer according to an embodiment of the present invention.

FIG. 9 illustrates a phosphorous layer according to an embodiment of the present invention. The flow then enters step S70, in which a phosphorous layer 8 is formed on top the protection layer 7. The phosphorous layer 8 contains phosphorous compound, and are restricted in a range defined by the phosphorous wall 98. According to an aspect of the embodiment, the phosphorous layer 8 is formed by coating or injecting a phosphorous compound on the protection layer 7.

Figure 10:
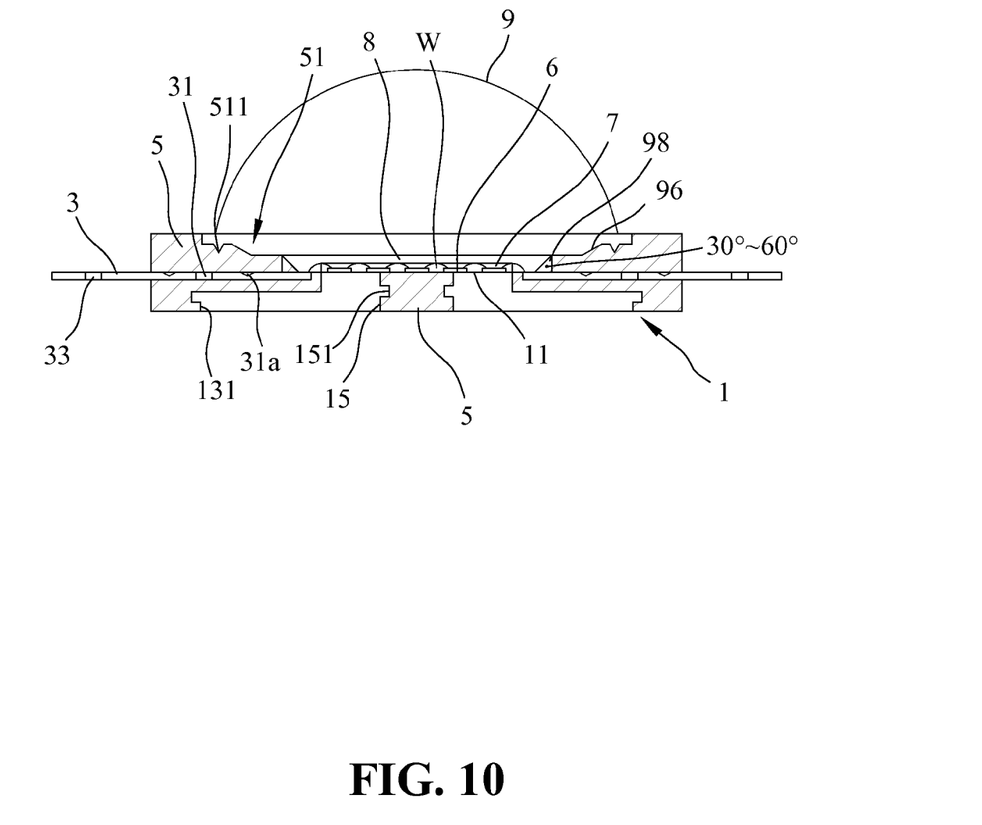
FIG. 10 illustrates a dome according to an embodiment of the present invention.

FIG. 10 illustrates a dome according to an embodiment of the present invention. Referring to FIG. 10, in step S80, an injection molding process is executed to a dome 9 on the upper surface of the molded platform 5. A bottom of the dome 9 completely fills up the dome embedding groove 511. In such a way, the optical reflectivity surface 96, the molded platform 5, and the LED dice 6 are tightly secured together and are well protected by the dome 9. Preferably, the dome 9 is transparent serves as a lens for converging a light passing therethrough.

Figure 11:
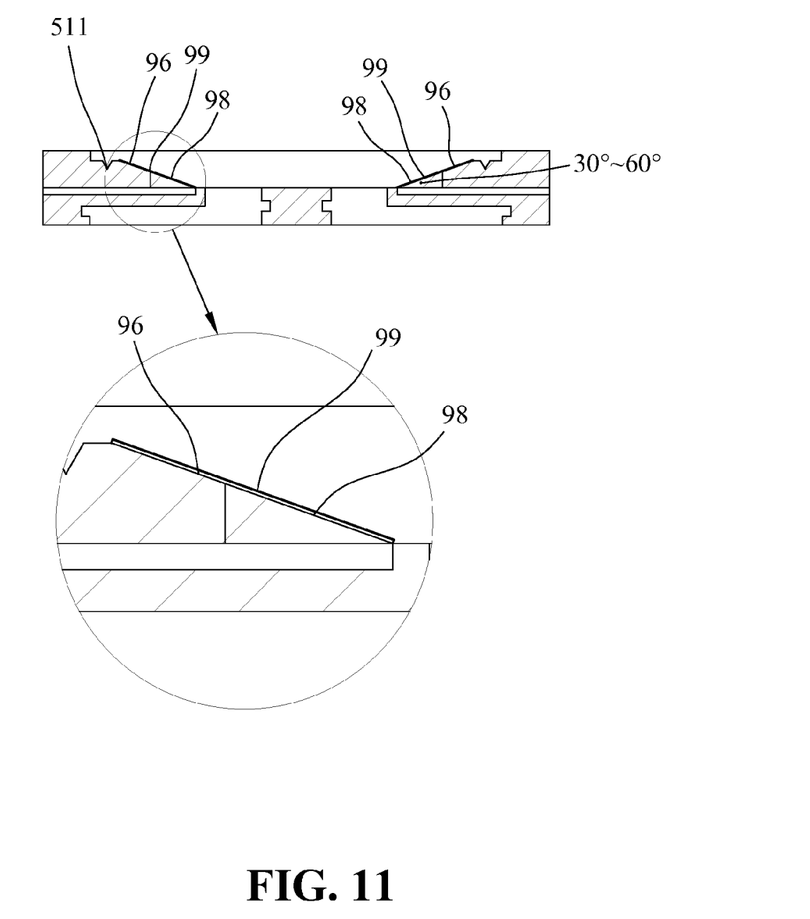
FIG. 11 illustrates a metal reflector cap disposed on an optical reflectivity surface and a phosphorous wall according to another embodiment of the present invention.

FIG. 11 illustrates a metal reflector cap 99 disposed on the optical reflectivity surface 96 and the phosphorous wall 98 according to another embodiment of the present invention. As shown in FIG. 11, there is no step configured between the inner sidewall of the upper molded platform 51 and the phosphorous wall 98, as presented in FIG. 5. The inner sidewall is configured with an inclined angle between 30° and 60° relative to the upper surface of the lighting area 11. The phosphorous wall 98 circularly defines an inner space for containing the phosphorous compound and forming the phosphorous layer 8 therein. The metal reflector cap 99 is seated on the optical reflectivity surface 96 and the phosphorous wall 98 of the upper molded platform 51.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method of making a multilayer light emitting diode (LED) array engine, comprising:
    preparing a base plate frame comprising at least one lighting area, and two lead frame grooves, wherein the lighting area is located at a center of the base plate frame, and the two lead frame grooves are positioned at a front side and a rear side of the base plate frame, wherein the base plate frame further comprises at least one first locking hole and at least one through hole at each of a left side and a right side of the base plate frame, and at least two dented grooves corresponding to each of the two lead frame grooves;
    positioning two lead frames inside accommodating spaces defined in the two lead frame grooves, respectively, wherein each lead frame groove comprises an inner connection portion positioned adjacent to the lighting area and an outer connection portion positioned relatively apart from the lighting area, wherein the outer connection portion protrudes exceeding a peripheral edge of the base plate frame and each lead frame groove comprises at least one second locking hole and at least one second lock-in groove between the inner connection portion and the outer connection portion;

executing an injection molding process to form a molded platform on the base plate frame, wherein the molded platform surrounds the lighting area, and fills up the first locking holes, and the molded platform is positioned between the lighting area and the through holes, wherein the molded platform sequentially buries the dented grooves, fills up the lead frame grooves, and covers the lead frames, wherein the molded platform does not cover the upper side of the inner connection region and the periphery of the outer connection region, wherein a portion of the molded platform located above the lighting area is defined as an upper molded platform, and the upper molded platform comprises an inner sidewall, on which an optical reflectivity surface is configured, a dome embedding groove configured at a top portion of the upper molded platform and positioned above the optical reflectivity surface, and a phosphorous wall positioned beneath the inner wall of the upper molded platform;

arranging a plurality of LED dice in an array form on an upper surface of the base plate frame;

electrically coupling the LED dice to the lead frames by bonded wires to form a circuit;

forming a protection layer on the LED dice and the bonded wires;

forming a phosphorous layer on the protection layer, wherein the phosphorous layer is formed by providing a phosphorous compound within a range defined by the phosphorous wall; and forming a dome on the upper surface of the molded platform by executing an injection molding process, wherein a bottom of the dome completely fills up the dome embedding groove.

2. The method as claimed in claim 1, wherein the optical reflectivity surface is a light reflective surface on the inner sidewall of the upper molded platform, and the method further comprises a step of configuring a thin layer of nickel or chromium on the light reflective surface and the phosphorous wall.

3. The method as claimed in claim 1, wherein the optical reflectivity surface is a metal reflector cap placed on the inner sidewall and the phosphorous wall.

4. The method as claimed in claim 1, wherein a first locking groove is configured surrounding the first lighting area.

5. The method as claimed in claim 1, wherein the two lead frames remain noncontact with the upper surface of the base plate frame.

6. The method as claimed in claim 4, wherein the first locking groove has a U-shaped or V-shaped cross-section.

7. The method as claimed in claim 1, wherein the base plate frame is prepared by conducting a stamping process, chemical etching process, or a high voltage wire cutting process.

8. The method as claimed in claim 1, wherein the base plate frame is made of a material selected from the group consisting of copper (Cu), aluminum (Al), Cu alloy, and Al alloy.

9. The method as claimed in claim 1, wherein the upper surface of the base plate frame comprises a reflective layer, and the reflective layer has a good thermal conductivity and a good light reflectivity.

10. The method as claimed in claim 1, wherein the outer connection portion is configured with a plurality of solder holes.

11. The method as claimed in claim 1, wherein the protection layer is made of a dielectric material and is formed on the LED dice and the bonded wires.

12. The method as claimed in claim 1, wherein the protection layer is made of a silicon-based light transparent epoxy.

13. The method as claimed in claim 1, wherein a phosphorous compound is injected on an upper surface of the protection layer, and is restricted in the range defined by the phosphorous wall and surrounding the lighting area.

14. The method as claimed in claim 1, wherein the molded platform is made of an epoxy resin.

15. The method as claimed in claim 1, wherein the phosphorous wall is configured with an inclined angle in a range of 30° to 60° relative to the upper surface of the base plate frame.

16. The method as claimed in claim 1, wherein the optical reflectivity surface has an inclined angle in a range of 30° to 60° relative to the upper surface of the base plate frame.

17. The method as claimed in claim 1, wherein the dome embedded groove has a U-shaped, or V-shaped cross-section.

18. The method as claimed in claim 1, wherein the dome is made of transparent silicon gel or silicon-based material.

19. The method as claimed in claim 1, wherein the metal reflector cap is adapted for being installed with an inclined angle in a range of 30° to 60° relative to the upper surface of the base plate frame.

20. The method as claimed in claim 1, wherein the two dented grooves are configured at an edge of a bottom side of the base plate frame, and the two dented grooves are spaced one from another.

* * * * *